USOO5634828A

United States Patent [19]
Stanley

[11] Patent Number: 5,634,828
[45] Date of Patent: Jun. 3, 1997

[54] CAPACITIVE PICKUP CLIP

[75] Inventor: John E. Stanley, Racine, Wis.

[73] Assignee: Snap-on Technologies, Inc., Lincolnshire, Ill.

[21] Appl. No.: 474,734

[22] Filed: Jun. 7, 1995

[51] Int. Cl.$^6$ .................................................. H01R 4/52
[52] U.S. Cl. .......................... 439/819; 439/482; 324/72.5; 324/690
[58] Field of Search ........................ 439/819, 820, 439/821, 822, 477, 478, 482, 950, 219, 481; 324/402, 126, 72.5, 690

[56] References Cited

U.S. PATENT DOCUMENTS

| | | | |
|---|---|---|---|
| 1,867,944 | 7/1932 | Nijland | 324/72.5 |
| 2,453,761 | 11/1948 | Schoonmaker | 439/477 |
| 2,488,328 | 11/1949 | Rider | 324/72.5 |
| 2,547,080 | 4/1951 | Hebeler | 439/820 |
| 2,969,519 | 1/1961 | Thomas | 439/219 |
| 3,182,257 | 5/1965 | Linkowski | 324/72.5 |
| 3,768,005 | 10/1973 | Louks | 324/555 |
| 3,821,689 | 6/1974 | Graham | 439/482 |
| 3,996,511 | 12/1976 | Baer | 324/556 |
| 4,041,373 | 8/1977 | Maringer | 324/402 |
| 4,105,968 | 8/1978 | Mobley et al. | 324/133 |
| 4,263,547 | 4/1981 | Johnson | 324/72.5 |
| 4,835,469 | 5/1989 | Jones et al. | 324/72.5 |
| 4,891,586 | 1/1990 | Leber et al. | 324/72.5 |
| 5,208,541 | 5/1993 | Yerkovich et al. | 324/395 |
| 5,274,336 | 12/1993 | Crook et al. | 324/690 |

OTHER PUBLICATIONS

Illustration of Bosch capacitive pickup clip and photograph of same.
Schematic of Snap-on prior art capacitive pickup clip.

*Primary Examiner*—Neil Abrams
*Assistant Examiner*—T. C. Patel
*Attorney, Agent, or Firm*—Emrich & Dithmar

[57] ABSTRACT

A clip is used for receiving one of a plurality of wires of various sizes. The clip includes a non-movable portion including a wire receiving surface and a movable portion disposed at least partially externally of the non-movable portion. The movable portion includes a wire engaging surface disposed opposite and facing the wire receiving surface, with the surfaces defining wire receiving jaws operable between a closed jaw condition and an open jaw condition. A biasing element is coupled to the portions biasing the surfaces to the closed jaw condition. The movable portion is reciprocally movable from the closed jaw condition to the open jaw condition against the urging of the biasing element.

20 Claims, 1 Drawing Sheet

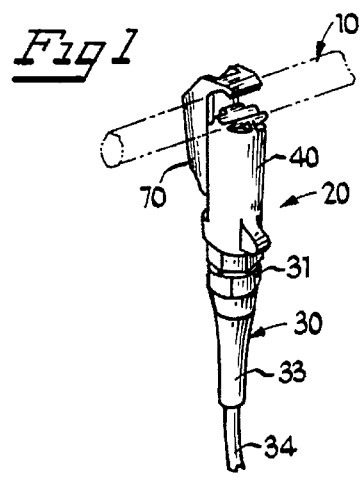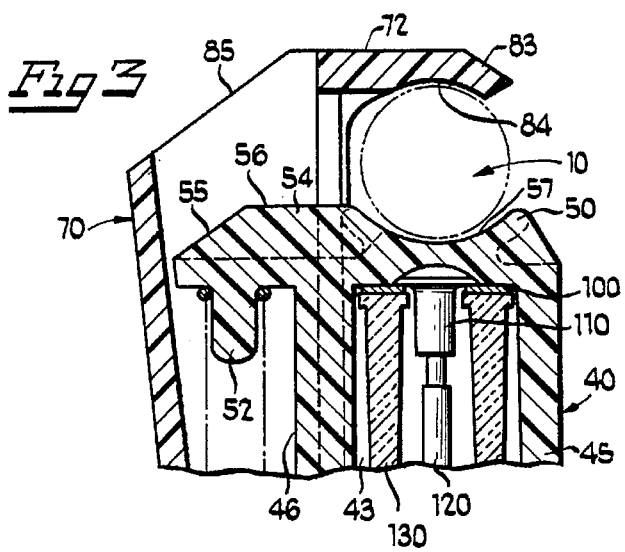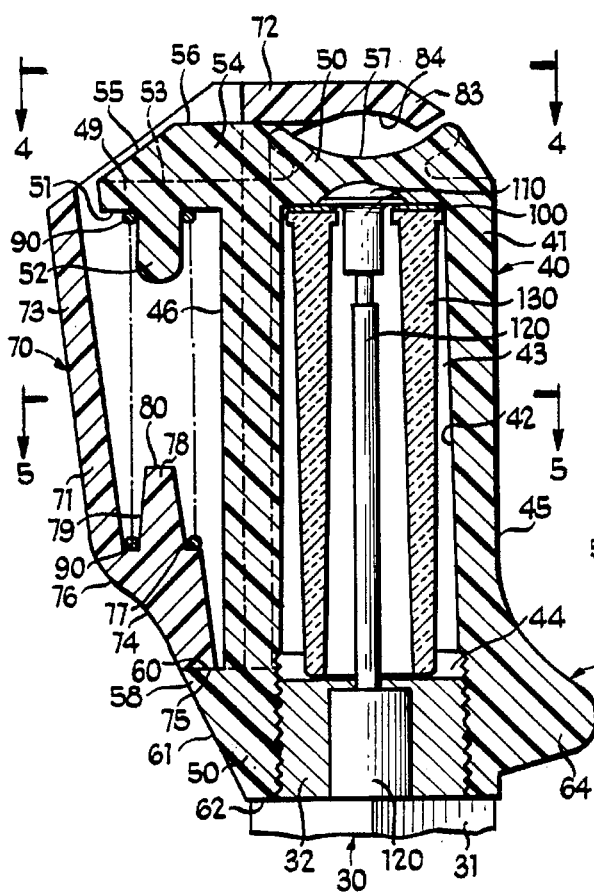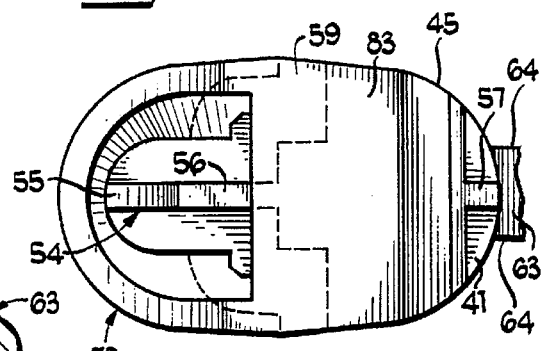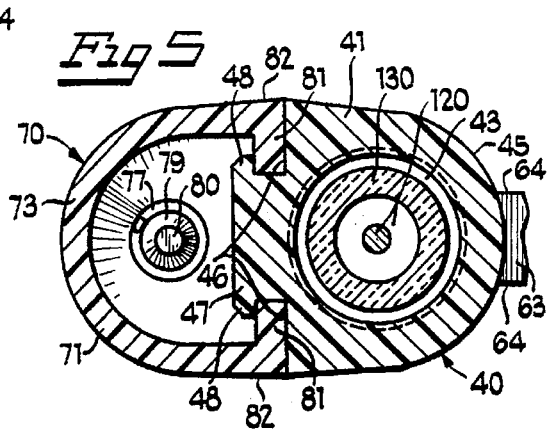

CAPACITIVE PICKUP CLIP

BACKGROUND OF THE INVENTION

1. Field of the Invention

The present invention relates generally to the field of wire clips and, more particularly, to a capacitive pickup clip for detecting secondary voltage signals in an electronic ignition system.

2. Description of the Prior Art

Capacitive probes or pickup clips are well known in the field of automotive ignition system testing. Pickup clips respond to voltage changes in their immediate vicinity and are therefore useful in capacitively picking up the ignition pulses of an ignition system of an externally ignited internal combustion engine.

Capacitive pickup clips are most commonly used to detect voltage levels at a secondary ignition cable of ignition systems, including remote coil and distributorless ignition systems. The clips are connected directly over a current-carrying wire, thus making it unnecessary to disconnect wires or like ignition system components to measure the voltage at the wire.

As a voltage occurs in a wire, such as a secondary wire or cable of an ignition system, an electrostatic field is generated around the wire. By placing a capacitive pickup clip around the wire, the electrostatic field will be capacitively coupled to a plate or a washer within the clip causing a small voltage to be charge coupled thereto. The charge coupled voltage capacitively detected by the pickup clip is proportional to the voltage at the secondary wire. A wire connection coupled to the pickup clip ultimately communicates the detected voltage signals to an electronic unit, such as an engine analyzer or like waveform analyzing device.

Pickup clips are adapted with some means to effect hooking onto wires. One prior art capacitive pickup clip, manufactured by Bosch, Inc., includes spaced-apart, partially deflectable jaws formed integrally with an associated cap. The jaws have arcuate recesses on the inner facing surfaces thereof and are sized for engagement around a wire of fixed diameter. The Bosch clip is available with differently-sized, threadedly-engageable removable caps to effect use of the clip with wires of various sizes. The Bosch clip suffers the disadvantage of requiring a user to change caps when coupling to a larger or a smaller size wire.

Another type of prior art clip, manufactured by Snap-on, Inc., is provided with arcuate jaws joined at the wire receiving end thereof but separable when urged against a wire. Once the wire is engaged, the arcuate jaws enclose at least a portion of the received wire. The jaws are deflectable outwardly to accommodate wires of various sizes. Because the jaws are separable only at the receiving end, large size wires are not easily accommodated between the facing arcuate surfaces on the jaws. Also, clipping to an oversized wire could permanently deform the jaws, so that they would not firmly grip smaller wires. A poorly grasped wire may lead to inaccuracies in the detected voltage levels and may also result in the clip becoming disengaged from the wire under the weight of the clip pulling on the wire.

It would be a significant advancement in the art to be able to provide a capacitive pickup clip that can be used with a large range of differently-sized wires and which requires no interchangeable parts to achieve this end.

Conventional clips also suffer the disadvantage of two-handed wire-to-clip installation. The one hand of a user is generally required to hold the wire in a fixed position while the other hand is used to push the clip onto the wire, wedging the wire between the jaws. It would be an improvement in the art, therefore, to be able to provide a clip that permits clip-to-wire engagement with only one hand.

SUMMARY OF THE INVENTION

It is a general object of the present invention to provide a capacitive pickup clip that overcomes the disadvantages of prior art clips and is also economical and easy to manufacture.

It is another object of the present invention to provide a clip that can be used for coupling to a wide range of wire sizes.

It is yet another object of the present invention to provide a clip that can be used for coupling to a wire using only one hand.

These and other features of the invention are attained by providing a clip for receiving one of a plurality of wires of various sizes. The clip includes a non-movable portion including a wire receiving surface and a movable portion disposed at least partially externally of the non-movable portion. The movable portion includes a wire engaging surface disposed opposite and facing the wire receiving surface, with the surfaces defining wire receiving jaws operable between a closed jaw condition and an open jaw condition. A biasing element is coupled to the portions biasing the surfaces to the closed jaw condition. The movable portion is reciprocally movable from the closed jaw condition to the open jaw condition against the urging of the biasing element.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

FIG. 1 is a perspective view of a capacitive pickup clip constructed in accordance with and embodying the features of the present invention, with the clip shown disposed around a wire subject to voltage shown in phantom;

FIG. 2 is an enlarged, fragmentary, vertical cross-sectional view of the clip of FIG. 1, with the jaws of the clip shown in their normal fully closed condition;

FIG. 3 is a view similar to FIG. 2, showing the topmost portion of the clip, with the jaws of the clip shown open and disposed around a wire;

FIG. 4 is a fragmentary, end elevational view taken generally along the line 4—4 in FIG. 2; and FIG. 5 is a horizontal sectional view taken generally along the line 5—5 in FIG. 2.

DETAILED DESCRIPTION OF THE PREFERRED EMBODIMENT

Referring to FIGS. 1–2, there is illustrated a portion of a wire 10 that is subject to voltage and around which is disposed a capacitive pickup clip 20, the latter constructed in accordance with and embodying the features of the present invention.

The pickup clip 20 includes a threaded strain relief member 30, a non-movable, elongated, main body portion 40, a movable slide portion 70, and a resilient biasing spring 90.

The main body portion 40 and the slide portion 70 are preferably made of plastic or similar suitable material. The spring 90 is preferably a metallic-type, straight, helical compression spring. All other components described herein are of conventional construction and material of manufacture.

The strain relief member 30 includes a base portion 31 having a generally polygonal cross-section to facilitate coupling a driving tool thereto, an externally threaded portion 32 projecting upwardly from the base portion 31, and a wire-receiving section 33 extending below the base portion 31. An insulated clip wire 34 of fixed diameter extends axially through the wire receiving portion 33, the base portion 31 and the threaded portion 32, and is engageable therewith in a conventional manner.

The main body portion 40 includes a generally cylindrical elongated body 41 having an inner cylindrical surface 42 defining a cavity 43 being blind at the forward end having an internally threaded portion 44 for engagement with the threaded portion 32 of strain relief member 30. Within the cavity 43 are conventionally disposed the voltage detecting components of the clip 20, including a charge coupling washer 100, a contact button 110, a wire coupling member 120, and a shielded insulator 130.

The voltage detecting components function cooperatively and in a known manner for generating a voltage signal representative of the voltage in the wire 10. It should be understood that the interconnection between the strain relief member 30 and the voltage detecting components of the clip 20 is conventional and forms no part of the present invention. The invention relates generally to the external construction of the clip 20, which will now be described with reference to FIGS. 2–5.

The main body portion 40 is shown in greater detail in FIG. 2. The elongated body 41 of portion 40 includes a partially ellipsoidal outer surface 45 and an intersecting slide-portion connecting surface 46. A portion 47 projects laterally from the surface 46 along its entire length and includes a pair of longitudinally extending teeth 48 (see FIG. 5) projecting in opposite directions from the sides thereof to form tracks. A guide portion 49 projects laterally from the surface 46 also at the forward end 50 of the main body portion 40. From the rear surface 51 of guide portion 49 projects a spring receiving guide 52 having a substantially circular-cylindrical shape and sized to snugly receive one end of the biasing spring 90. From the forward surface 53 of guide portion 49 extends a thin-walled projection 54 having an inclined surface 55 intersecting a flat surface 56 (see FIGS. 2 and 4). The flat surface 56, in turn, intersects a wire receiving surface 57 at the front end of main body portion 40. The wire receiving surface 57 is generally arcuate-shaped and sized to receive any one of a large range of differently-sized wires 10.

The surface 46 further includes a slide-portion receiving lip 58 centrally disposed along a rear end 59 of portion 40. The lip 58 is defined by a flat surface 60 intersecting an inclined wall 61 extending downwardly toward a base surface 62 of portion 40. Diametrically opposite lip 58 and on ellipsoidal surface 45 is provided a finger-rest projection 63 having a generally arcuate peripheral surface and flat side surfaces 64.

The slide portion 70 is generally L-shaped and includes a longitudinally extending, curved body 71 having a front portion 72, a middle portion 73 and a thumb receiving rear portion 74, the portion 74 being defined by a flat end surface 75 which intersects an arcuate, upwardly-inclined, thumb-receiving surface 76. From a forward surface 77 of thumb receiving portion 74 extends a spring guide 78 defined by a frustoconically-shaped side surface 79 and a flat end surface 80. The spring guide 78 is sized for snug engagement with the rear end of biasing spring 90. When the clip 20 is in its assembled state, shown in the figures and described below in greater detail, guide 78 of slide portion 70 will be spaced axially opposite and facing the spring receiving guide 52 disposed on the main body portion 40.

Additionally, a pair of longitudinal projections 81 extend laterally inwardly toward each other from opposite facing sides 82 of the curved body 71 and are sized for sliding mating engagement in the tracks between the teeth 48 and the surface 46 on main body portion 40 (see FIG. 5). The front portion 72 of curved body 71 consists of a jaw section 83 having an inner surface defining a wire engaging surface 84. The wire engaging surface 84 is arcuate-shaped and disposed opposite and facing the wire receiving surface 57. The two surfaces 57, 84 cooperatively define jaw surfaces separable in response to a one-handed reciprocating movement of the slide portion 70 relative to the main body portion 40, as will be described below, to permit operation of the clip 20 between the closed and open jaw conditions. The portion 72 extends laterally from an inclined surface section 85 at the front of middle portion 73, surface section 85 having an opening therein to expose the guide portion 49 when the clip 20 is in its assembled state.

During initial assembly, the voltage detecting components are properly positioned within cavity 43 and securely enclosed therein by the threaded engagement of main body portion 40 with threaded portion 32 of strain relief member 30. Strain relief member 30 functions to protect the end of wire 34 closest thereto from abuse during clip use. The opposite end of wire 34 may be provided with a suitable connector end for interfacing to an electronic unit (not shown), all in a conventional manner.

Once the main body portion 40 is engaged to the strain relief member 30 in a conventional manner, the slide portion 70 is brought close thereto to effect coupling of the respective spring 90 ends around the guides 52 and 78 of main body portion 40 and slide portion 70, respectively. The projections 81 on slide portion 70 are then snapped into mating engagement with the teeth 48 on main body portion 40 coupling the respective components into the fully assembled position, shown by FIG. 2.

Once fully assembled, spring 90 will bias the slide portion 70 rearwardly to a closed jaw condition shown in FIG. 2. The slide portion 70 is reciprocally slidable longitudinally forwardly, against the urging of the biasing spring 90, to position the clip 20 in an open Jaw condition, as shown in FIG. 3. To effect sliding of the portion 70, a user grasps the clip 20 in one hand, resting the forefinger of the hand against the front arcuate surface of the finger-rest projection 63 and using the thumb to apply a forwardly directed force against the thumb-receiving portion 59, thus resiliently compressing the spring 90 and moving the jaw section 83 forwardly away from the wire receiving surface 57. With the clip 20 in this open jaw condition, any one of a number of differently-sized wires 10 can be received between respective jaw surfaces 57, 84, and be centered relative thereto as a consequence of the arcuate nature of the surfaces 57, 84.

When the forwardly directed force effecting sliding of the portion 70 is released, the slide portion 70 returns to the closed jaw position under the urging of the biasing spring 90. Toward this end, the biasing force of the spring must be sufficiently great to permit the clip to securely engage, between its jaws, the wire 10.

While the present invention has been generally disclosed in connection with capacitive pickup clips, it should be appreciated that the clip 20 of the present invention is equally useful in any number of related applications, including inductive type pickup clips, and the like.

Also, while a particular embodiment of the present invention has been shown and described, it will be appreciated by those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. A clip for receiving one of a plurality of wires of various sizes, comprising:

a non-movable portion including a wire receiving surface;

a movable portion disposed for movement externally of said non-movable portion and including a wire engaging surface disposed opposite and facing said wire receiving surface, the surfaces defining wire receiving jaws operable between a closed jaw condition and an open jaw condition;

a biasing element coupled to said portions and biasing said surfaces to the closed jaw condition; and track structure disposed externally of said non-movable portion for coupling thereof to said movable portion and limiting said movable portion to only reciprocating movement between the closed jaw condition and the open jaw condition thereof.

2. The clip of claim 1, wherein said movable and non-movable portions are made of plastic.

3. The clip of claim 1, wherein said clip is a capacitive pickup clip.

4. The clip of claim 1, wherein said movable portion is generally L-shaped and slidably movable with respect to said non-movable portion.

5. The clip of claim 1, wherein said clip is a capacitive pickup clip including a washer, an insulator and a contact button enclosed by said non-movable portion and held in place by a threaded strain relief mechanism.

6. The clip of claim 1, wherein said clip is sized and shaped for clipping onto wires having diameters between 4 mm and 12 mm, inclusive.

7. The clip of claim 1, wherein said biasing element is a resilient biasing spring and said movable and non-movable portions include first and second guides, respectively, for matingly coupling respective ends of said spring thereto.

8. The clip of claim 7, wherein said spring is a helical, compression spring.

9. The clip of claim 7, wherein at least one of said surfaces includes a recess for centering a wire received between the surfaces.

10. The clip of claim 1, wherein said movable portion includes a thumb-receiving portion engageable by the thumb of a user's hand which grasps the non-movable portion to effect sliding of said movable portion to the open jaw condition against the urging of said biasing element, whereby the clip is engageable with a wire using only one hand.

11. The clip of claim 10, wherein said non-movable portion includes a finger-rest projection engageable by the forefinger of the user's hand to facilitate sliding said movable portion.

12. A clip for receiving one of a plurality of wires of various sizes, comprising:

an elongated main body portion including at least one longitudinally extending external recess and a wire receiving surface;

a slide portion disposed externally of said main body portion and including at least one projection mateably engageable with said at least one recess and a wire engaging surface disposed opposite and facing said wire receiving surface, said surfaces defining wire receiving jaws operable between a closed jaw condition and an open jaw condition;

a resilient biasing spring coupled to said portions and urging said jaws to the closed jaw condition; and said at least one projection cooperating with said at least one recess to form track structure limiting said slide portion to only reciprocating movement between the closed jaw condition and the open jaw condition thereof.

13. The clip of claim 12, wherein said elongated main body portion includes a laterally projecting portion having a pair of parallel longitudinally extending teeth extending in opposite directions from the sides thereof, said slide portion including a pair of parallel longitudinally extending projections mateably engageable with said teeth to facilitate sliding said slide portion against said main body portion.

14. The clip of claim 12, wherein said main body portion and said slide portion include first and second guides, respectively, for matingly coupling respective ends of said spring thereto.

15. The clip of claim 12, wherein said main body portion and said slide portion are made of plastic.

16. The clip of claim 12, wherein at least one of said surfaces includes a recess for centering a wire to be received between the surfaces.

17. The clip of claim 12, wherein said slide portion is generally L-shaped and disposed at least partially externally of said main body portion.

18. The clip of claim 12, wherein said clip is a capacitive pickup clip including a washer, an insulator and a contact button enclosed by said main body portion and held in place by a threaded strain relief mechanism.

19. The clip of claim 12, wherein said clip is sized and shaped for clipping onto wires having diameters between 4 mm and 12 mm, inclusive.

20. The clip of claim 12, wherein said slide portion includes a thumb-receiving portion engageable by the thumb of a user's hand which grasps the main body portion to effect sliding said slide portion against the urging of said biasing spring, whereby the clip is engageable with a wire using only one hand.

* * * * *